United States Patent [19]
Caldwell et al.

[11] Patent Number: 5,153,572
[45] Date of Patent: Oct. 6, 1992

[54] TOUCH-SENSITIVE CONTROL CIRCUIT

[75] Inventors: David W. Caldwell; Nicholas W. Medendorp, both of Holland, Mich.

[73] Assignee: Donnelly Corporation, Holland, Mich.

[21] Appl. No.: 535,111

[22] Filed: Jun. 8, 1990

[51] Int. Cl.$^5$ .............................................. G09G 3/02
[52] U.S. Cl. ..................................... 340/712; 341/24; 307/112
[58] Field of Search ................ 84/618, 689, 643, 656, 84/684, 733, DIG. 2, DIG. 7, DIG. 8, DIG. 20, DIG. 22; 341/24, 25, 33; 307/112, 113, 231; 340/712

[56] References Cited

U.S. PATENT DOCUMENTS

| | | |
|---|---|---|
| 2,737,647 | 3/1956 | Oliwa ................................. 341/25 |
| 2,782,308 | 2/1957 | Rug . |
| 3,040,178 | 6/1962 | Lyman et al. . |
| 3,200,304 | 4/1965 | Atkins . |
| 3,200,305 | 8/1965 | Atkins . |
| 3,200,306 | 8/1965 | Atkins . |
| 3,254,313 | 5/1966 | Atkins . |
| 3,275,897 | 9/1966 | Atkins . |
| 3,549,909 | 12/1970 | Adelson . |
| 3,624,645 | 11/1971 | Gluck et al. ........................ 341/24 |
| 3,641,410 | 2/1972 | Vogelsberg . |
| 3,651,391 | 3/1972 | Vogelsberg . |
| 3,666,988 | 5/1972 | Bellis . |
| 3,719,767 | 3/1973 | Matumoto et al. ............. 84/DIG. 8 |
| 3,796,880 | 3/1974 | Dorey ............................... 341/25 X |
| 3,798,370 | 3/1974 | Hurst . |
| 3,839,710 | 10/1974 | Rogers ............................. 341/24 X |
| 3,846,791 | 11/1974 | Foster . |
| 3,899,713 | 8/1975 | Barkan et al. . |
| 3,911,215 | 10/1975 | Hurst et al. . |
| 3,958,239 | 5/1976 | Green ................................... 341/24 |
| 3,965,465 | 6/1976 | Alexander . |
| 3,984,757 | 10/1976 | Gott et al. . |
| 4,031,408 | 6/1977 | Holz . |
| 4,056,699 | 11/1977 | Jordan . |
| 4,061,453 | 4/1977 | Moennig . |
| 4,071,689 | 1/1978 | Talmage et al. . |
| 4,090,092 | 5/1978 | Serrano . |
| 4,101,805 | 7/1978 | Stone . |
| 4,101,886 | 7/1978 | Grimes et al. . |
| 4,119,864 | 10/1978 | Petrizio . |
| 4,123,631 | 10/1978 | Lewis . |
| 4,136,291 | 1/1979 | Waldron . |
| 4,145,748 | 3/1979 | Eichelberger et al. . |
| 4,152,629 | 5/1979 | Raupp . |
| 4,159,473 | 6/1979 | Senk . |
| 4,161,766 | 7/1979 | Castleberry et al. . |
| 4,174,517 | 11/1979 | Mandel . |
| 4,185,210 | 1/1980 | Zuk ................................... 341/24 X |
| 4,210,822 | 7/1980 | Wern . |
| 4,211,959 | 7/1980 | Deavenport et al. . |
| 4,213,061 | 7/1980 | Conner . |
| 4,220,815 | 9/1980 | Gibson et al. . |
| 4,223,301 | 9/1980 | Grimes et al. . |
| 4,237,386 | 12/1980 | Instance . |
| 4,246,533 | 1/1981 | Chiang . |
| 4,264,831 | 4/1981 | Wern . |
| 4,289,972 | 9/1981 | Wern . |

(List continued on next page.)

Primary Examiner—Ulysses Weldon
Attorney, Agent, or Firm—Price, Heneveld, Cooper DeWitt & Litton

[57] ABSTRACT

A touch responsive user selection system including a plurality of touch pads on an insulated substrate and a logic circuit for responding to the change of impedance of any of the pads for setting or resetting a latch and thereby producing an output signal indicative of a user selection. A coincidence detector responds to the simultaneous change of impedance of two or more different touch pads by inhibiting the logic circuit from producing an output signal both during the coincidence and for a predetermined period of time after the coincidence has ceased. The logic circuit is made up of components that are arranged in a fashion that causes the circuit to respond to a ratio of signals that vary in proportion to supply voltage. In this manner, a touch-responsive system is provided that may be used with an unregulated power supply while functioning with extreme variations in supply voltage.

12 Claims, 3 Drawing Sheets

U.S. PATENT DOCUMENTS

| | | |
|---|---|---|
| 4,289,980 | 9/1981 | McLaughlin . |
| 4,290,052 | 9/1981 | Eichelberger et al. . |
| 4,293,987 | 10/1981 | Gottbrecht et al. . |
| 4,304,976 | 12/1981 | Gottbrecht et al. . |
| 4,323,829 | 4/1982 | Witney et al. . |
| 4,360,737 | 11/1982 | Leopold . |
| 4,374,381 | 2/1983 | Ng et al. . |
| 4,380,040 | 4/1983 | Posset . |
| 4,394,643 | 7/1983 | Williams . |
| 4,400,758 | 8/1983 | Frame . |
| 4,413,252 | 11/1983 | Tyler et al. . |
| 4,439,647 | 3/1984 | Calandrello et al. . |
| 4,476,463 | 10/1984 | Ng et al. . |
| 4,493,377 | 1/1985 | Gunther et al. . |
| 4,495,485 | 1/1985 | Smith . |
| 4,529,968 | 7/1985 | Hilsum et al. . |
| 4,535,254 | 8/1985 | Khatri . |
| 4,550,310 | 10/1985 | Yamaguchi et al. . |
| 4,561,002 | 12/1985 | Chui . |
| 4,567,470 | 1/1986 | Yoshikawa et al. . |
| 4,584,519 | 4/1986 | Gruodis . |
| 4,614,937 | 9/1986 | Poujois . |
| 4,651,133 | 3/1987 | Ganesan et al. . |
| 4,731,694 | 3/1988 | Grabner et al. . |
| 4,736,190 | 4/1988 | Fiorella . |
| 4,740,781 | 4/1988 | Brown . |
| 4,743,895 | 5/1988 | Alexander . |
| 4,855,550 | 8/1989 | Schultz, Jr. . |
| 4,894,493 | 1/1990 | Smith et al. . |
| 4,901,074 | 2/1990 | Sinn et al. . |
| 4,920,343 | 4/1990 | Schwartz . |

TOUCH-SENSITIVE CONTROL CIRCUIT

BACKGROUND OF THE INVENTION

This invention relates to devices for receiving user input selections. More particularly, the invention concerns a circuit that responds to an increase in capacity as a result of a user contacting a conductive touch pad.

Switching circuits that respond to either the proximity of a user's limb or the physical contacting of a touch pad by a user, are desirable because the lack of mechanical movement avoids a source of failure. However, the cost for such touch-sensitive control circuits has tended to be prohibitive in all but the most expensive equipment because of the requirement for a regulated power supply and other compensating circuitry. While the supply of regulated power is ample in a high-end appliance incorporating, for example, a microprocessor, there exists a need for a touch control circuit that is capable of either energizing or deenergizing an electrical load in an application that does not otherwise require a regulated power supply. Not only does an "ON/OFF" system typically not require a regulated power supply to switch the load, the switching device that energizes and deenergizes the load may cause very large changes in the level of the supply voltage. In some applications, energizing the load may reduce the supply voltage by 50% or more. Accordingly, there is a need for a touch-responsive circuit that is substantially insensitive to very large swings in its supply voltage.

While circuits which alternatingly energize and deenergize a load typically respond to successive user touches of a single touch pad, other applications utilize multiple touch pads on a common substrate. For example, a numeric keypad and an input control circuit having discrete on and off touch pads are but two examples of multiple user selection means. Because the touch pads are located on a common substrate and cleaning fluid provides a path between pads, it has been necessary to manually disable the circuit whenever it is necessary to clean the substrate. Any user contact with a pad while cleaning the substrate would cause an ambiguous input condition in which multiple selections appear to be made at once. At other times, a user may inadvertently contact more than one touch pad and, hence, provide an ambiguous input condition to the touch circuit.

SUMMARY OF THE INVENTION

A touch-sensitive control circuit according to the invention is embodied in a system having at least first and second user selection devices that are actuatable by a user for receiving user selections. A control circuit responsive to a user actuating the selection devices produces an output signal indicative of the user selection device that is being actuated. The control circuit further includes a coincidence detector for detecting the simultaneous actuation of the first and second user selection devices. In this manner, the ambiguous selections may be ignored.

A touch-sensitive control circuit according to another aspect of the invention is embodied in a system having a user selection device that is actuatable by a user for receiving user selections and logic circuitry for processing signals received from the selection device and determining a user selection. The control circuit performs logic operations on the basis of the ratiometric relationship of signals that vary in proportion to the supply voltage provided to the circuit. This may further include circuit timing functions that are configured to prevent an undesirable timing sequence notwithstanding a significant change in supply voltage.

These and other objects, advantages and features of this invention will become apparent upon review of the following specification in conjunction with the drawings.

DESCRIPTION OF THE PREFERRED EMBODIMENT

Figure 1A:
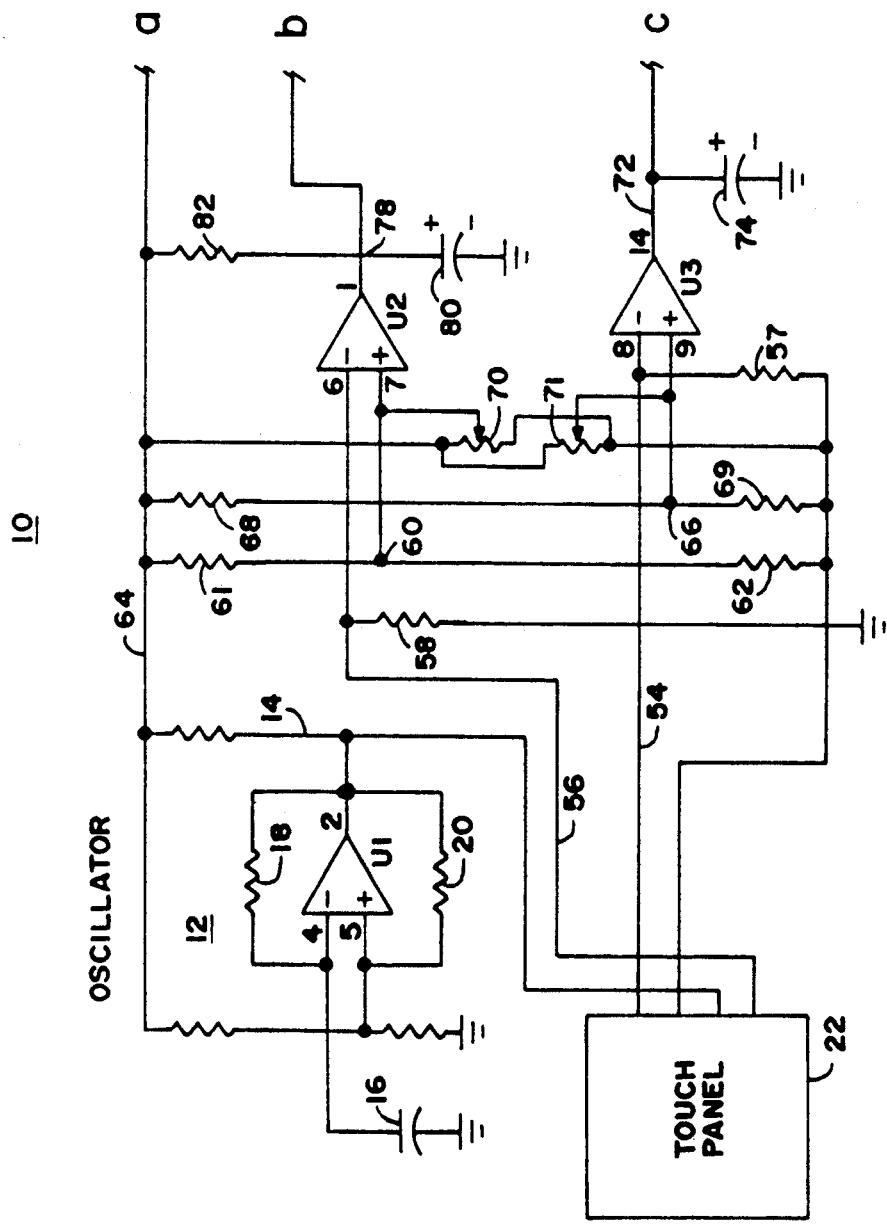
FIGS. 1a and 1b are a schematic diagram of a touch-sensitive control circuit embodying the invention.
Figure 1B:
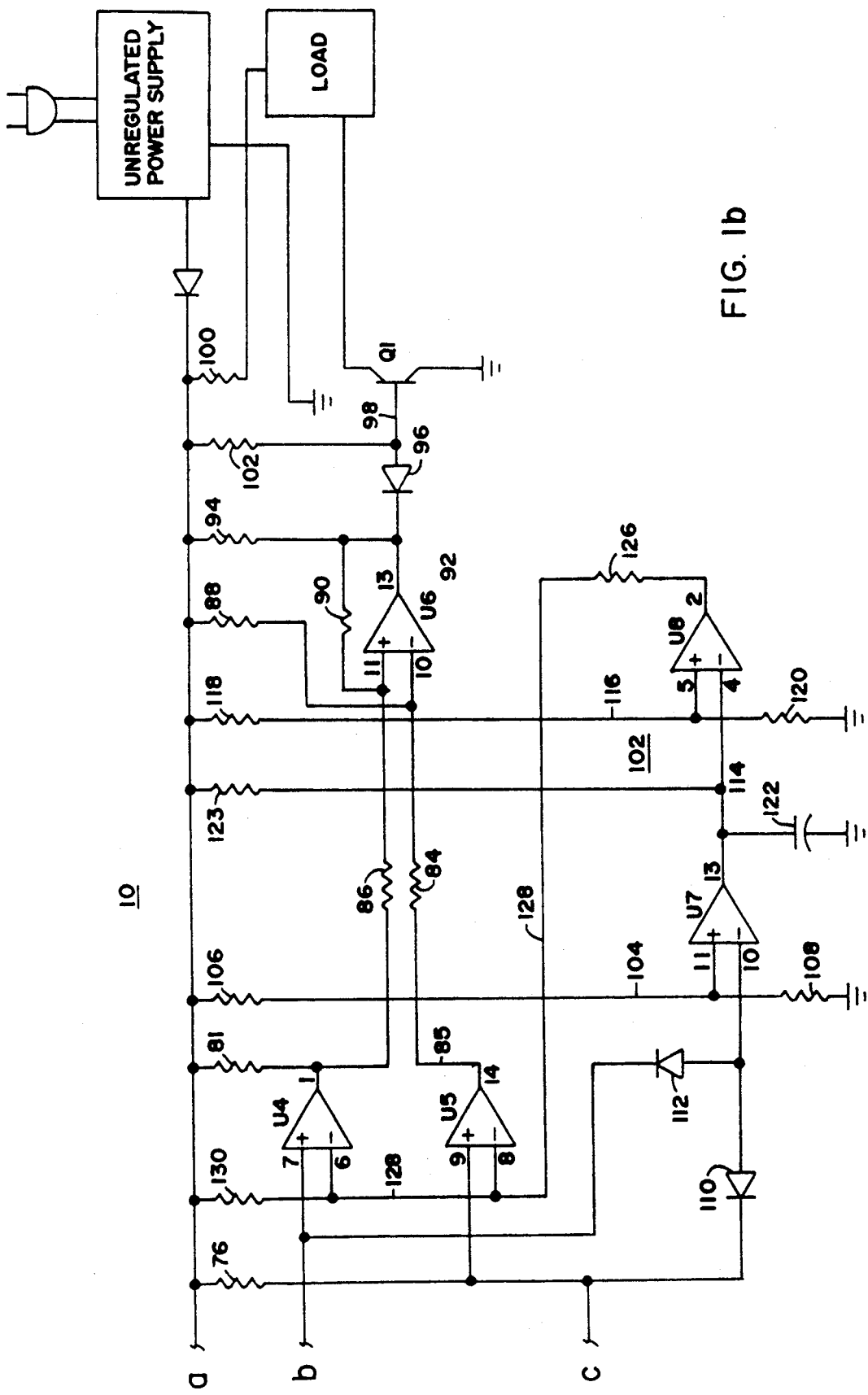
Figure 2:
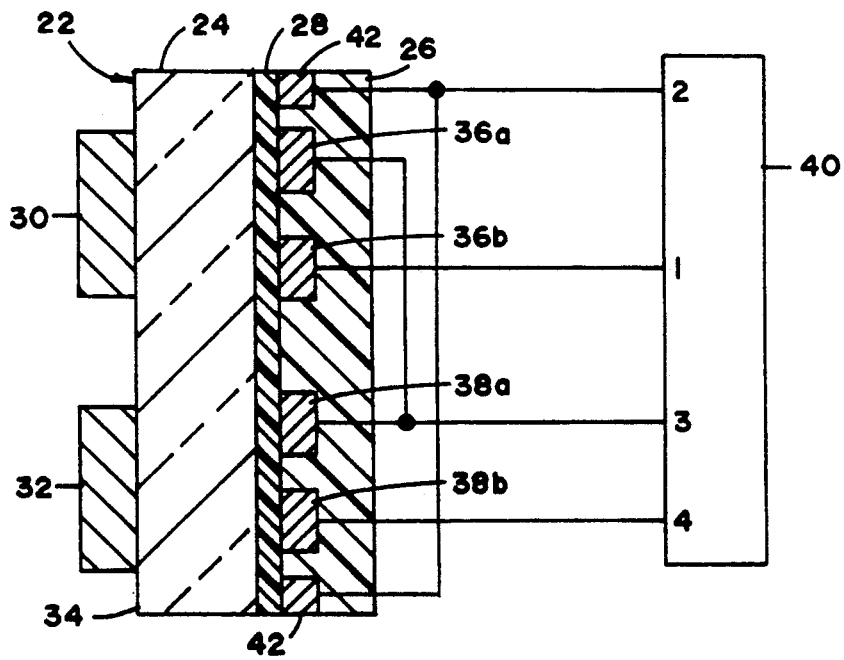
FIG. 2 is a sectional view of a touch panel with which the invention is especially useful.

Referring now specifically to the drawings, and the illustrative embodiments depicted therein, touch-sensitive control circuit 10 includes an oscillator 12 for producing a squarewave output on line 14 which extends to a connector P1. Oscillator 12 includes a comparator U1 connected with a capacitor 16 and feedback resistors 18 and 20 to provide a feedback oscillator. The squarewave from line 14 is provided to a touch panel 22 (FIG. 2).

Touch panel 22 includes a substrate, such as glass 24, and a mylar contact carrier 26, which are secured together by an adhesive layer 28. A plurality of conductive touch pads, illustrated as 30 and 32, are mounted on outer surface 34 of substrate 24. In the illustrated embodiment, suitable indicia (not shown) identifies touch pad 30 as "ON" and touch pad 32 as "off." In a preferred embodiment, touch pads 30 and 32 are substantially transparent and indicia is provided opposite surface 34. In a most preferred embodiment, touch pads 30 and 32 preferably are made from tin antimony oxide. However, they may additionally be made from indium tin oxide or from a sintered glass frit, which is an amalgam of very finely ground glass mixed with binders that include a conductive carrier agent. With such touch pads being substantially transparent, the mylar carrier may be augmented by a light source in order to provide backlighting of contacts 30 and 32. Mylar carrier 26 carries a pair of adjacent pads 36a, 36b opposite touch pad 30 and pair 38a, 38b opposite touch pad 32. The squarewave produced on line 14 is supplied through a connector 40, connected with connector P1, to pads 36a and 38a. Pads 36b and 38b are connected, respectively, with pins 1 and 4 of connector P1. A ground terminal 2 of connector P1 is connected with a ground shield 42 on contact carrier 26.

Figure 3:
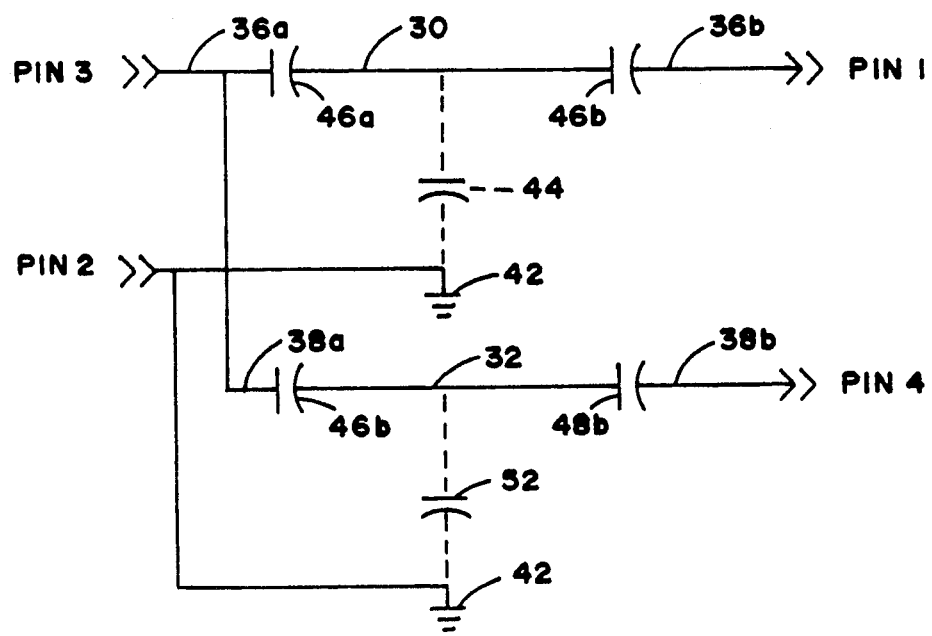
FIG. 3 is a schematic diagram of the circuit equivalent of the touch panel in FIG. 2.

The circuit equivalent of touch panel 22 is illustrated in FIG. 3. Capacitors 46a and 48a represent, respectively, the capacitance between pad 36a and touch pad 30 and the capacitance between touch pad 30 and pad 36b. Capacitors 46b and 48b represent, respectively, the capacitance between pad 38a and touch pad 32 and the capacitance between touch pad 32 and pad 38b. With a squarewave applied from pin 3 of P1 to pads 36a and 38a, a series of differentiated pulses appear on pad 36b and 38b. The body capacitance of a user touching touch pad 30 is represented by a capacitor 44 from touch pad 30 to ground 42. Likewise, the body capacitance of a user touching touch pad 32 is represented as a capacitor 52 between touch pad 32 and ground 42. The effect of a user touching touch pad 30 is to attenuate the pulses delivered from pad 36b to pin 1 of connector P1. Likewise, the effect of a user contacting touch pad 32 is to attenuate the pulses delivered by pad 38b to pin 4 of connector P1.

The stream of differentiated pulses from the "ON" selection portion of touch panel 22 is provided from pin 1 of connector P1 via line 54 to the inverting input of a comparator U3. The stream of differentiated pulses from the "OFF" selection portion of touch panel 22 is supplied via line 56 to the inverting input of a comparator U2. Very high impedance resistors 57, 58 are provided between lines 54, 56 and signal ground. The noninverting input of comparator U2 is connected to a reference voltage established at a junction 60 of a voltage divider provided by resistors 61 and 62 connected in series between a supply voltage rail 64 and signal ground. The noninverting input of comparator U3 is connected to a reference voltage established at a junction 66 of a voltage divider provided by resistors 68 and 69 connected in series between rail 64 and signal ground. Optional potentiometers 70 and 71 provide adjustability to the reference voltage established at junctions 60 and 66.

If the user is not touching "ON" touch pad 30, the pulses on line 54 will exceed the reference voltage established at junction 66. As each pulse exceeds its reference, a current-sinking output 72 of comparator U3, which has an open-collector configuration is pulled to signal ground against the bias of pull-up resistor 76. This discharges a capacitor 74 connected between output 72 and signal ground. If a user is touching "ON" pad 30, the attenuated pulses on line 54 will not exceed the reference voltage at junction 66. Accordingly, comparator U3 will not pull its output 72 to signal ground, thus, allowing capacitor 74 to charge through resistor 76. The "OFF" selection circuit, including comparator U2, functions in the same manner. If no contact is made with touch pad 32, the pulses on line 56 will exceed the reference on junction 60, which will cause comparator U2 to pull its output 78 to signal ground, which will discharge capacitor 80 connected between output 78 and signal ground. If a user contacts touch pad 32, the attenuative pulses will not switch the output of comparator U2 and capacitor 80 will charge through resistor 82.

The positive voltage on output 72, which indicates an "ON" selection is selectively passed through a buffer comparator U5 and resistor 84 to the noninverting input of a comparator U6. The positive voltage on output 78, which indicates an "OFF" selection is selectively passed through a buffer comparator U4 and resistor 86 to the inverting input of comparator U6. A resistor 88 connects the noninverting input of U6 to voltage rail 64 and a feedback resistor 90 extends between an output 92 of comparator U6 to its inverting input. A resistor 94 extends between output 92 and voltage rail 64. A positive going "ON" signal at output 72 causes output 92 of comparator U6 to be pulled positive by resistor 94 provided that buffer comparator U5 does not inhibit the "ON" signal. A positive going "OFF" signal at output 78 causes output 92 to be switched to low ground. U6 functions as a latch because, output 83 going positive will force output 92 to go low. The feedback resistor 90 latches output 92 in the low state. Likewise, when output 85 goes positive, output 92 will go positive and be latched in that state through resistor 90.

Output 92 is connected through a diode 96 to the base 98 of a transistor Q1. The emitter of transistor Q1 is connected to signal ground and its collector is connected to an output terminal 4. A load that is to be operated by touch-sensitive control circuit 10 is connected between terminals 2 and 4. Terminal 2 is connected through a resistor 100 to positive rail 64. Accordingly, when output 92 of comparator U6 is at a positive level, a resistor 102 connected between base 98 and rail 64 will pull base 98 positive, which will cause transistor Q1 to conduct. When transistor Q1 conducts, a current is produced in the load which is energized. When output 92 is pulled low, it clamps base 98 low, which causes transistor Q1 to be nonconducting. When this occurs, there is no current supplied to the load which is deenergized.

Touch sensitive control circuit 10 additionally includes coincidence detection means, generally indicated at 102, for detecting the simultaneous occurrence of a positive voltage signal on output 72, indicating an "ON" selection and a positive voltage signal on output 78 indicating an "OFF" selection. This may occur under various circumstances, such as the user inadvertently contacting both touch pads 30 and 32. Additionally, such condition may arise when a cleaning solution is applied to surface 34 of touch panel 24, which causes a coupling between touch pads 30 and 32. Hence, if a user touches one of the touch pads, it will appear as if both touch pads 30 and 32 were touched. Coincidence detection means 102 includes a comparator U7 having its noninverting input connected to a reference voltage established at the junction 104 of a voltage divider defined by resistors 106 and 108 connected in series between voltage rail 64 and signal ground. The inverting input to comparator U7 is connected through a diode 110 to output 72 and through a diode 112 to output 78. An output 114 of comparator U7 is connected with the inverting input of a comparator U8, whose noninverting input is connected with a reference voltage established at the junction 116 of a voltage divider defined by resistors 118 and 120 connected in series between voltage rail 64 and signal ground. A capacitor 122 is connected between output 114 and signal ground and a pull-up resistor is connected between output 114 and the voltage rail 64. An output 124 of comparator U8 is connected through series resistors 126 and 130 to voltage rail 64. The junction 128 between resistors 126 and 130 is connected with the inverting inputs of comparators U4 and U5.

Coincidence detection means 102 function as follows. As long as one of the outputs 72 or 78 is low, indicating that the associated touch pad is not being touched, the inverting input to comparator U7 is held below the reference voltage at junction 104. Under such conditions, output 114 is allowed to be pulled positive by resistor 123 to a level above the reference voltage established at junction 116. Hence, output 124 of comparator U8 will be pulled low and the voltage on junction 128 will be less than the voltage at rail 64. Under these conditions, the buffer comparator U4, U5, having the positive selection signal applied to its noninverting input will switch its output to an open condition. Output 83 of buffer comparator U4 is connected by resistors 81, 86, 90 and 94 extending to rail 64 and output 85 of buffer comparator U5 is connected with a pull-up resistor combination 84, 88 to rail 64. Thus, the switching of either output 83 or 85 to an open state will cause it to be pulled to a positive level. Accordingly, in this mode with only one user input being received, the buffer comparators "enable" the valid input to be provided to the latch defined by comparator U6.

If, however, outputs 72 and 78 are both positive, indicating that both touch pads 30 and 32 are touched, the inverting input to comparator U7 is allowed to rise about the reference established at junction 104, causing output 114 to be pulled low. With output 114 low, the output 124 of comparator U8 is no longer clamped to ground and is allowed to rise such that the voltage junction 128 supplied to the inverting inputs of comparators U4 and U5 is raised to the voltage of rail 64. When this occurs, outputs 83 and 85 of comparators U4 and U5, respectively, are clamped to ground which disables the coincidental user selections by preventing output 92 of comparator U6 from changing states. Therefore, diodes 110 and 112 form an NAND gate with comparator U7 by causing a low signal on output 114 when outputs 72 and 78 are both high. Buffer comparators U4 and U5 act as gates which are enabled to allow output 72 or 78 to actuate the latch defined by comparator U6, as long as there is no coincidence of actuation, but disables outputs 72 and 78 from actuating the latch defined by comparator U6 whenever coincidence is detected.

Coincidence detection means further includes time-delay means defined by capacitor 122 and resistor 123. When comparator U7 drives output 114 low, indicating the detection of coincident inputs, capacitor 122 is rapidly discharged through the output transistor of comparator U7. When the coincidence is no longer present, output 114 increases gradually according to a time constant established by resistor 123 and capacitor 122. This delay prevents an inadvertent change in output 92 as a user removes a coincident input. Otherwise, it would be possible for the last of the outputs 72, 78 to go high to cause output 92 to inadvertently change states.

Touch-sensitive control circuit 10 will power-up in an "OFF" mode. This is accomplished as follows. Resistors 84 and 88 define a first voltage divider for establishing a start-up voltage at the inverting input of comparator U6. Resistors 86, 90 and 94 define another voltage divider which establishes a power-up voltage on the inverting input of comparator U6 which is greater than the power-up voltage defined at the noninverting input of comparator U6. Accordingly, upon initial power-up, output 92 will be pulled to ground which will turn off transistor Q1 and, hence, deenergize the load (not shown) connected across terminals 2 and 4.

In order to allow touch-sensitive control circuit 10 to operate from an unregulated power supply and to switch a significant load in comparison to the capabilities of the unregulated power supply, it is necessary for the circuit to function properly with a 50% or greater reduction in its supply voltage. Such an application is illustrated in commonly-owned, U.S. patent application Ser. No. 07/535,104 filed concurrently herewith by Nicholas W. Medendorp et al for a MODULAR POWER OUTLET STRIP, the disclosure of which is hereby incorporated herein by reference. This is accomplished by providing a ratiometric relationship between signals processed in circuit 10. Because the ratio of signals, not their absolute values, provides for all logic decisions, the effect on signal levels from power supply fluctuations is effectively suppressed. One manner in which such ratiometric relationship is maintained is that comparators U2 through U8, which perform the logic functions of circuit 10, utilize a "floating" reference which varies in proportion to the variation of the supply voltage on rail 64. This is accomplished with a voltage divider established between rail 64 and signal ground. Therefore, as the voltage on rail 64 varies, the reference level for comparators U2 through U8 varies in proportion with the voltage on rail 64. Because the peak level of differentiated pulses received from the touch pads will also vary with supply voltage, a relative proportion is maintained between these signals in circuit 10.

Touch-sensitive control circuit 10 is additionally substantially insensitive to significant changes in its supply voltage because the time delays provided therein are ratiometric in that they are established to maintain a relative timing sequence notwithstanding a significant modification in their absolute values. For example, in order for coincidence detection means 102 to operate properly under all supply voltage variations, the time constant established at output 114 of comparator U7 is designed to be greater than the time constant established with respect to outputs 72 and 78 of comparators U3 and U2, respectively. This ratiometric relationship is maintained even though supply voltage variations will cause significant changes in the absolute value of these time delays. In the disclosed embodiment, this is accomplished without imparting the appearance of "sluggish" operation of circuit 10. In the illustrated embodiments, the following component values are chosen to provide such coordinated time delay and to provide power-up-to-"OFF":

| COMPONENT | VALUE |
|---|---|
| Resistor 82 | 100 K |
| Capacitor 80 | .22 UF |
| Resistor 76 | 100 K |
| Capacitor 74 | .22 UF |
| Resistor 123 | 100 K |
| Capacitor 122 | 4.7 UF |
| Resistor 84 | 100 K |
| Resistor 86 | 100 K |
| Resistor 88 | 1 MEG |
| Resistor 90 | 470 K |
| Resistor 94 | 100 K |

Touch-sensitive control circuit 10 incorporates low offset, temperature-compensated comparators for U1 through U8. Such comparators are commercially available from a number of manufacturers and are marketed under the designation LM339.

The touch-sensitive control circuit disclosed herein is capable of many applications. In the embodiment illustrated in the Caldwell et al patent application referred to above, touch-responsive control circuit 10 is applied to provide user command input signals to a controllable high voltage plug strip. However, circuit 10 could additionally be utilized as an input device for intrusion alarm systems and other security devices. Furthermore, although touch-sensitive responsive switch 10 is illustrated herein as a two-input "ON/OFF" selection device, the principles may be applied to an input device having additional selections, such as a numeric keypad. In such a system, it may be desirable to arrange the touch pads in a matrix fashion and to utilize multiplexing techniques, which are known in the art.

Other changes and modifications in the specifically described embodiments can be carried out without departing from the principles of the invention which is intended to be limited only by the scope of the appended claims, as interpreted according to the principles of patent law including the doctrine of equivalents.

The embodiments of the invention in which an exclusive property or privilege is claimed are defined as follows:

1. A user touch-sensitive selection system comprising:
    first user selection means actuatable by a user for generating a first signal;
    second user selection means actuatable by a user for generating a second signal;
    a control circuit responsive within a first predetermined period of time to said first and said second signals for producing an output signal indicative of the one of said first and second user selection means being actuated; and
    said control circuit including coincidence detection means for detecting the simultaneous actuation of said first and second user selection means and inhibiting means responsive to said coincidence detection means for inhibiting said control circuit from changing said output signal upon the simultaneous actuation of said first and second user selection means, wherein said inhibiting means inhibits said control circuit from changing its output signal for a second predetermined period of time after termination of the simultaneous actuation of said first and second user selection means, said second predetermined period of time being significantly greater than said first predetermined period of time.

2. The selection system in claim 1 wherein said first and second user selection means have user sensitive touch pads on a common substrate.

3. The selection system in claim 1 including a latch that is set by said output signal indicating one of said user selection means being actuated and is reset by said output signal indicating another one of said user selection means being actuated.

4. A user touch-sensitive selection system comprising:
    a first user selection means actuatable by a user for receiving a user selection including a first touch pad on a surface of an insulated substrate;
    a second user selection means actuatable by a user for receiving a user selection including a second touch pad on said surface;
    first sensing means coupled to said first user selection means for producing a first signal indicative of a user contacting said first touch pad;
    second sensing means coupled to said second user selection means for producing a second signal indicative of a user contacting said second touch pad; and
    output means operative in less than a first predetermined period of time for producing an output signal having an output condition indicative of the presence of one of said first and second signals; and
    coincidence detection means coupled to said output means and responsive to said first and second signals occurring simultaneously for preventing said output signal from changing said condition, wherein said coincidence detection means prevents said output signal from changing said condition for a second predetermined period of time after termination of said first and second signals occurring simultaneously, said second predetermined period of time being significantly greater than said first predetermined period of time.

5. The selection system in claim 4 in which said coincidence detection means includes a logic gate responsive to the coincident occurrence of said first and second signals by producing a detection signal and buffer gate means responsive to said detection signal and said first and second signals for inhibiting said output from responding to said first and second signals when said detection signal is produced.

6. The selection system in claim 5 including delay means associated with said logic gate to retain said detection signal for said second predetermined period of time after termination of said coincident occurrence.

7. The selection system in claim 5 wherein said output means includes a latch that is set by one of said first and second signals and reset by the other of said first and second signals.

8. A user touch-sensitive selection system comprising:
    a plurality of user selection means individually actuatable by a user for receiving a plurality of user selections, said user selection means including a plurality of pads mounted on a common substrate and grouped together with one of said pads for each said user selection means;
    circuit means responsive to the change of impedance between each of said pads and ground for producing an output signal indicative of a user contacting the respective one of said pads; and
    coincidence detector means responsive to the simultaneous change of impedance between two or more different ones of said pads and ground for inhibiting said circuit means from producing said output signal, wherein said coincidence detector means inhibits said circuit means from producing said output signal for a predetermined period of time after termination of said simultaneous change of impedance.

9. The selection system in claim 8 including a latch receiving said output signal and responsive to one of said pads being contacted by a user to set said latch and another of said pads being contacted by a user to reset said latch.

10. The selection system in claim 8 wherein said circuit means is responsive without substantial delay to said change in impedance.

11. A user sensitive selection system operative from a source of supply voltage comprising:
    a first user selection means actuatable by a user for producing a selection signal including a first touch pad on a surface of an insulated substrate;
    a second user selection means actuatable by a user for receiving a user selection including a second touch pad on said surface;
    a logic circuit coupled to said first and second user selection means for producing an output signal having an output condition indicative of a user contacting one of said first and second user selection means, said logic circuit including first signal generation means for generating a first signal responsive to a user contacting said first touch pad, first comparison means for comparing said first signal with a first reference level that is proportional to said supply voltage to produce a first interim signal indicative of a user contacting said first touch pad, and said logic circuit including second signal generation means for generating a second signal responsive to a user contacting said second touch pad and second comparison means for comparing said second signal with a second reference level that is proportional to said supply voltage to produce a second interim signal;

said logic circuit including coincidence detection means for detecting the simultaneous actuation of said first and second user selection means and disabling means responsive to said coincidence detection means for disabling said first and second interim signals from changing said output condition, wherein said coincidence detection means includes a third comparison means for comparing said first and second interim signals with a third reference level that is proportional to said supply voltage to produce an inhibit signal that is proportional to said supply voltage, and wherein said disabling means includes a fourth comparison means for comparing said first interim signal with said inhibit signal to produce a first latch signal, and a fifth comparison means for comparing said second interim signal with said inhibit signal to produce a second latch signal;

wherein said logic circuit performs logic operations on the basis of ratio of signals such that said logic circuit is substantially resistant to supply voltage variations; and a first time delay means for producing a first time delay between said first signal and said first interim signal, a second time delay means for producing a second time delay between said second signal and said second interim signal and a third time delay between said first and second interim signals and said inhibit signal, wherein said first, second and third time delay means produce time delays that vary with said supply voltage in a manner that maintains a predetermined sequence among said first and second interim signals and said inhibit signal notwithstanding variations in said supply voltage.

12. The selection system in claim 11 including a latch that is responsive to said first and second latch signals for changing said output condition.

* * * * *